United States Patent [19]

Terada et al.

[11] Patent Number: 4,694,314
[45] Date of Patent: Sep. 15, 1987

[54] SEMICONDUCTOR DEVICE

[75] Inventors: Yasushi Terada; Takeshi Nakayama, both of Itami, Japan

[73] Assignee: Mitsubishi Denki Kabushiki Kaisha, Tokyo, Japan

[21] Appl. No.: 811,884

[22] Filed: Dec. 20, 1985

[30] Foreign Application Priority Data

Jan. 18, 1985 [JP] Japan .................................. 60-7719

[51] Int. Cl.[4] ............................................. H01L 29/78
[52] U.S. Cl. .................................. 357/23.6; 357/23.5; 357/41; 357/45; 365/185
[58] Field of Search ....................... 357/23.5, 23.6, 41, 357/45; 365/185

[56] References Cited

U.S. PATENT DOCUMENTS 4,397,077  8/1983  Derbenwick et al. ............. 357/23.6
4,527,258  7/1985  Guterman .......................... 357/23.5

OTHER PUBLICATIONS

"High-Voltage Regulation and Process Considerations for High-Density 5V-only E²PROM's by Duane H. Oto et al, IEEE Journal of Solid-State Circuits, vol. SC-18, No. 5, (1983), pp. 532-538.

Primary Examiner—Edward J. Wojciechowicz
Attorney, Agent, or Firm—Lowe Price LeBlanc Becker & Shur

[57] ABSTRACT

A semiconductor device in which a capacitor of a switched-capacitor included in an RC network for defining the rise time of a programming high-voltage pulse signal of an EEPROM is formed of an oxide film having a thickness corresponding to the thickness of a tunnel oxide film or an oxide film between a floating gate and a control gate so that a shift amount of a threshold voltage of a memory transistor is made constant even if the thickness of the tunnel oxide film or the oxide film between the floating gate and the control gate is deviated from a designed value.

6 Claims, 9 Drawing Figures

SEMICONDUCTOR DEVICE

BACKGROUND OF THE INVENTION

1. Field of the Invention

The present invention relates to a semiconductor device and particularly to an improvement of a programming high-voltage pulse generator in an electrically erasable programmable read-only memory of a 5 V single power source, i.e., 5 V-only EEPROM.

2. Description of the Prior Art

FIG. 1 is a schematic diagram showing a structure of a conventional programming high-voltage generator, as disclosed for example in "High-Voltage Regulation and Process Considerations for High-Density 5 V-only E²-PROM's" by Duane H. Oto et al., IEEE Journal of Solid-State Circuits, Vol. SC-18, No. 5 (1983), pp. 532–538. Referring to FIG. 1, the structure and the operation of the conventional circuit for generating a programming high-voltage pulse $V_{pp}$ will be described in the following.

This circuit comprises as a reference signal generating system: a reference voltage generator 1 for generating a reference voltage signal $V_{ref}$ for controlling the height of a programming high-voltage pulse $V_{pp}$ and supplying the reference voltage signal $V_{ref}$ to an RC network 5; an oscillator 2 for supplying two clock pulses nonoverlapping with each other to the respective gate electrodes of the MOS transistors 9 and 10 included in the RC network 5 so that the time constant of the RC network 5 is controlled; the RC network 5 for making gentle (or dull) the rise of the reference voltage signal $V_{ref}$ from the reference voltage generator 1 in response to the signal frequency from the oscillator 2 and providing the signal $V_{ref}$ to a node A; a timer 3 for generating a pulse signal for controlling the pulse width of the high-voltage pulse $V_{pp}$; and a switching MOS transistor 4 turning on and off in response to the signal from the timer 3 so as to control the potential at the node A.

The above stated RC network 5 comprises a switched-capacitor 6 and a capacitor 7. The switched-capacitor 6 comprises MOS transistors 9 and 10 turning on and off alternately by receiving at the gate electrodes thereof the two phase nonoverlapping clock signals from the oscillator 2 and also comprises a capacitor 11 having one electrode connected to a junction of the MOS transistors 9 and 10 and the other electrode grounded. The capacitors 7 and 11 each are structured by an oxide film formed by the same manufacturing process as for the gate oxide film of a MOS transistor.

Further, the circuit shown in FIG. 1 comprises as a signal amplifying system: a comparator 12 for receiving and comparing the potential at the node A and the level of a signal from a voltage divider 14 to provide an activation signal to a driver 15 if the potential at the node A is higher than the signal level from the voltage divider 14; a charge pump 13 operative in response to the activation signal from the driver 15 to multiply the voltage so as to provide a programming high-voltage pulse $V_{pp}$ to a memory transistor (not shown) of the EEPROM and to the voltage divider 14; and the voltage divider 14 for dividing the voltage signal received from the charge pump 13 by a predetermined division ratio and providing the result of the division to the comparator 12.

FIG. 2 is a diagram showing a waveform of the programming high-voltage pulse $V_{pp}$. The height h of the pulse $V_{pp}$ is controlled by the signal from the reference voltage generator 1; a rise time $\tau$ is controlled by the RC network 5; and a pulse width w is controlled by a signal from the timer 3.

Now, referring to FIGS. 1 and 2, the operation of the programming high-voltage generating circuit will be described.

When the signal supplied from the timer 3 to the MOS transistor 4 reaches the level "L", the MOS transistor 4 is brought into the OFF-state. On the other hand, the MOS transistors 9 and 10 turn on and off alternately in response to the clock signal from the oscillator 2. As a result, the output reference voltage $V_{ref}$ from the reference voltage generator 1 is transmitted to the node A through the RC network 5. The RC network 5 comprises the switched-capacitor 6 and the capacitor 7. The resistance value of the switched-capacitor 6 is controlled by the frequency of the clock signal from the oscillator 2 and by the ratio of the capacitance 7 and 11. Accordingly, in response to the turning-off of the MOS transistor 4, a signal having a gentle rise according to the time constant $\tau$ defined by the frequency of the signal from the oscillator 2 is supplied to the node A. The potential at the node A serves as an input of the comparator 12, where it is compared with the output voltage $V_{pp}$ from the charge pump 13 divided by the voltage divider 14. The output of the comparator 12 is supplied to the driver 15 for driving the charge pump 13. The comparator 12 generates a signal for activating the driver 15 when the potential at the node A is higher than the signal level from the voltage divider 14. Consequently, the voltage obtained by dividing the voltage at the node A by a division ratio of the voltage divider 14 becomes an output of the charge pump 13, that is, the programming high-voltage pulse $V_{pp}$.

Then, when the output of the timer 3 attains the level "H", the MOS transistor 4 is brought into the ON-state. Accordingly, the potential at the node A becomes a ground potential through the conducting MOS transistor 4, and as a result, the generation of the programming high-voltage pulse $V_{pp}$ from the charge pump 13 is stopped since the comparator 12 does not supply the activating signal to the drive circuit 15.

The potential at the node A rises to the level of the reference voltage signal $V_{ref}$ with the time constant $\tau$ of the RC network 5 in response to the turn-off of the MOS transistor 4. Consequently, the output pulse $V_{pp}$ from the charge pump 13 also rises with the time constant $\tau$. The height h of the pulse signal $V_{pp}$ is equal to a value obtained by dividing the reference voltage $V_{ref}$ by the division ratio of the voltage divider 14 and the pulse width w of the pulse signal $V_{pp}$ is determined by the output signal from the timer 3. The rise of the pulse $V_{pp}$ is made gentle by using the RC network 5 so that too high an electric field may not be applied to the tunnel oxide film (21 in FIG. 3) of the memory transistor of the EEPROM. Typically, the rise time constant $\tau$ is set to be 600 $\mu$sec.

FIG. 3 is a sectional view showing schematically a structure of a memory transistor of an EEPROM. In FIG. 3, the memory transistor comprises: a semiconductor substrate 20; a drain 18 and a source 19 formed at the surface of the semiconductor substrate 20; a floating gate 17 formed on the semiconductor substrate 20 through a first insulating layer to store electric charges; and a control gate 16 formed on the floating gate 17 through a second insulating layer for controlling the charge and discharge of the floating gate 17. In the following, the first insulating layer serving as a path for electric charges between the drain region 18 and the floating gate 17 is referred to as a tunnel oxide film 21, and the second insulating layer between the floating gate 17 and the control gate 16 is referred to as a polysilicon-polysilicon interlayer oxide film 23. $V_G$, $V_D$, and $V_S$ indicate the voltage supplied to the control gate 16, the drain 18 and the source 19, respectively.

Now, the programming operation of the EEPROM will be described. The programming operation comprises an erasing mode and a writing mode. First, the operation in the erasing mode will be described.

In the erasing mode, the high-voltage pulse $V_{pp}$ from the programming high-voltage generator shown in FIG. 1 is supplied to the control gate 16 ($V_g = V_{pp}$ in FIG. 3) while the source region 19, the drain region 18 and the substrate 20 are grounded ($V_S = V_D = 0$ in FIG. 3). At this time, a tunnel current flows between the drain region 18 and the floating gate 17 through the tunnel oxide film 21 and electrons are injected into the floating gate 17, so that the threshold voltage of the memory transistor is increased.

In the writing mode, the high-voltage pulse signal $V_{pp}$ from the high-voltage generator is applied to the drain 18 ($V_D = V_{pp}$ in FIG. 3), the source region 19 is held in an electrically floating state and the control gate 16 and the semiconductor substrate 20 are grounded ($V_G = 0$ in FIG. 3). Thus, electrons flow out of the floating gate 17 through the tunnel oxide film 21 so that positive charges are stored in the floating gate 17. As a result, the threshold voltage of the memory transistor is lowered. The electric field applied to the tunnel oxide film 21 for controlling a shift amount of the threshold voltage is determined by a ratio of a capacitance between the control gate 16 and the floating gate 17 and a capacitance between the floating gate 17 and the drain 18. When the thickness of the polysilicon-polysilicon interlayer oxide film 23 and the thickness of the tunnel oxide film 21 are changed, the intensity of the electric field applied to the tunnel oxide film 21 changes even if the same voltage is applied to the control gate 16 in the erasing mode for example. Therefore, even if the same programming high-voltage pulse signal $V_{pp}$ is applied to the control gate 16, the shift amount $\Delta V$th of the threshold voltage of the memory transistor of the EEPROM changes in case where the thicknesses of these oxide films varies.

FIGS. 4 and 5 are graphs showing the results obtained by simulation concerning a change in a threshold voltage shift amount $\Delta V$th in case where the thicknesses of the oxide films varies in the erasing mode. Although the following description concerns only the erasing mode for ocnvenience sake, it is the same with the writing mode.

FIG. 4 is a graph showing a threshold voltage shift amount $\Delta V$th obtained by simulation in case where the thickness of the tunnel oxide film 21 varies in a range of 80 Å to 100 Å with the thickness of the polysilicon-polysilicon oxide film 23 being maintained 800 Å. In FIG. 4, the horizontal axis represents a pulse width of the programming high-voltage pulse $V_{pp}$ and the vertical axis represents a threshold voltage shift amount $\Delta V$th. As is clear from FIG. 4, in case where the pulse width of the high-voltage pulse $V_{pp}$ is 2 milliseconds with the potential of the pulse $V_{pp}$ being 21 V and the rise time constant $\tau$ of the pulse $V_{pp}$ being 0.6 millisecond, the threshold voltage shift amount $\Delta V$th changes in a range of 1.9 V to 4.5 V according to the thickness of the tunnel oxide film.

FIG. 5 is a graph showing a threshold voltage shift amount $\Delta V$th obtained by simulation in case where the thickness of the polysilicon-polysilicon interlayer oxide film 23 is changed in a range of 700 Å to 900 Å with the thickness of the tunnel oxide film being maintained 90 Å. In FIG. 5, the horizontal axis represents a pulse width of the pulse $V_{pp}$ and the vertical axis represents a threshold value shift amount $\Delta V$th. The potential (height) of the pulse $V_{pp}$ is 24 V and the rise time constant $\tau$ of the RC network 5 is 1 millisecond. In this case also, in the same manner as in FIG. 4, it can be seen that the threshold voltage shift amount $\Delta V$th largely changes according to the change of the thickness of the polysilicon-polysilicon interlayer oxide film.

Therefore, if the thicknesses of the oxide films are varied, it is necessary to change the waveform of the high-voltage pulse $V_{pp}$ according to the thicknesses of the oxide films so as to obtain a constant threshold voltage shift amount $\Delta V$th. This is because the change of the threshold voltage is caused by the flowing-in and flowing-out of electric charges in the floating gate and the flowing-in and flowing-out amount of electric charges is defined by the height h and the pulse width w of the high-voltage pulse $V_{pp}$ and the rise time constant $\tau$ of the RC network.

It is important to make the threshold voltage shift amount $\Delta V$th constant for the purpose of securing the reliability of the EEPROM and a stable operation for reading and retaining the stored data in the EEPROM.

Conventionally, as described in the above stated prior art reference, control is made by a program to change the level of the output signal $V_{ref}$ of the reference voltage generator for each chip according to the thicknesses of the oxide films. However, the above described conventional method involves problems that the time required for a function test of an EEPROM is long and a programming device for controlling the output of the reference voltage generator needs to be provided.

SUMMARY OF THE INVENTION

Therefore, the present invention has been accomplished to solve the above described problems and it is an object of the present invention to provide a semiconductor device in which if the thicknesses of the oxide films in the memory transistors are changed, the waveform of a pulse signal $V_{pp}$ is automatically adjusted according to the film thicknesses, so that a threshold voltage shift amount $\Delta V$th is made constant.

In a programming high-voltage generator in accordance with the present invention, a capacitir of an RC network is formed of an oxide film having a thickness equal to the thickness of a tunnel oxide film or a polysilicon-polysilicon interlayer oxide film or both of them in a memory transistor of an EEPROM, as is different from a conventional circuit in which a capacitor of an RC network was formed by the same manufacturing process as for a gate oxide film of a MOS transistor included in an EEPROM.

A high-voltage generator in accordance with the present invention operates in the below described manner. If the high-voltage pulse $V_{pp}$ has the same pulse waveform, the threshold voltage shift amount $\Delta V$th would largely change according to the change of the thickness of the tunnel oxide film and/or the polysilicon-polysilicon interlayer oxide film. However, with the above described structure, if the thickness of the oxide film is smaller, the capacitance value of the capacitance of the RC network becomes larger and the time constant $\tau$ of the RC network becomes also larger and accordingly, the high-voltage pulse $V_{pp}$ has a gentle rise. If the thickness of the oxide film is larger, the high-voltage pulse $V_{pp}$ has a sharp rise on the contrary. Thus, according to a gentle rise or a sharp rise of the high-voltage pulse $V_{pp}$, an amount of charges flowing into or flowing out of the floating gate changes. Therefore if the thicknesses of the oxide films are changed, the rise of the high-voltage pulse $V_{pp}$ is adapted according to the change, which makes it possible to decrease to minimum a change in the threshold voltage shift amount.

The above described object and other object and features of the present invention will become more apparent from the following detailed description when taken in conjunction with the drawings.

DESCRIPTION OF THE PREFERRED EMBODIMENTS

In the following, an embodiment of the present invention will be described with reference to the drawings.

Figure 6:
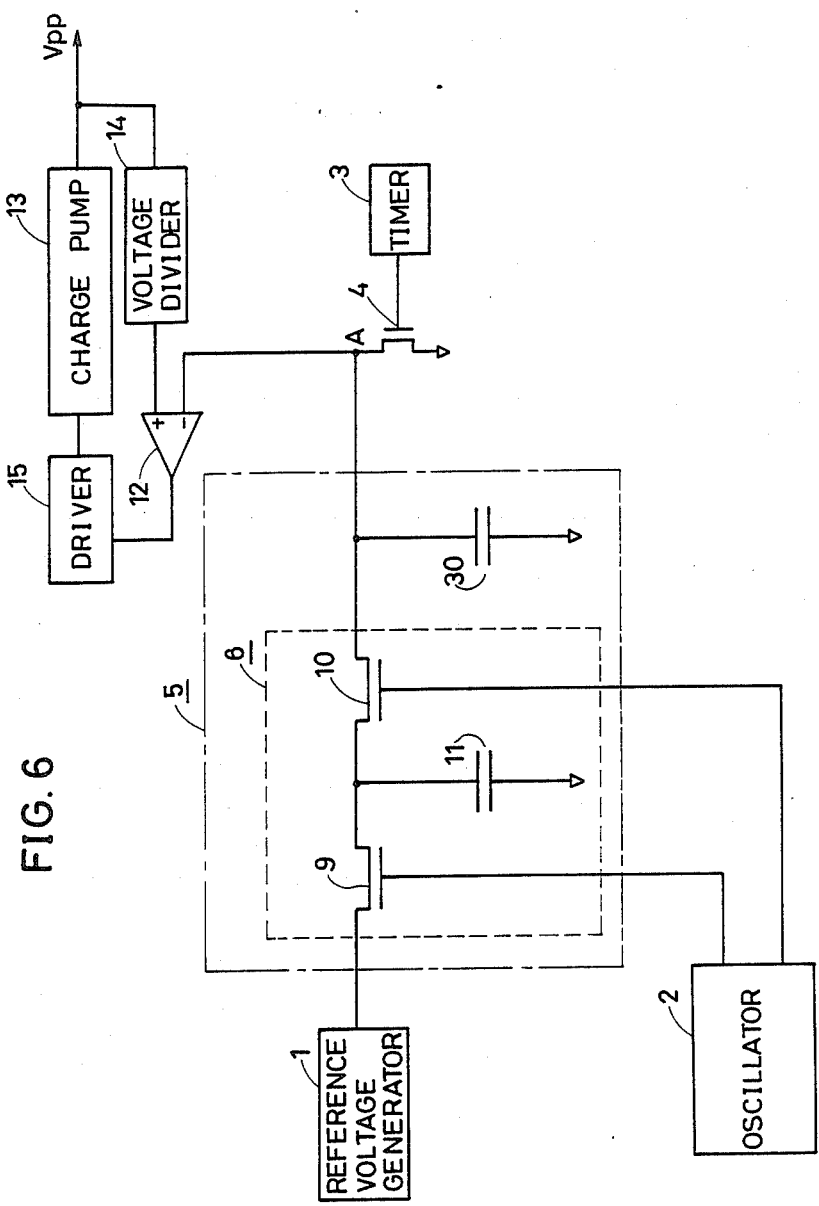
FIG. 6 is a schematic block diagram showing a structure of a programming high-voltage pulse generator in accordance with an embodiment of the present invention.

FIG. 6 is a diagram showing a configuration of a programming high-voltage generator in accordance with an embodiment of the present invention. The circuit configuration is the same as that of a conventional circuit except for the below described point. A characteristic feature of the present invention is that a capacitor 30 of an RC network 5 is formed by the same manufacturing process as for a tunnel oxide film of a memory transistor of an EEPROM so as to be of an oxide film having a thickness equal to that of the tunnel oxide film.

Figure 7A:
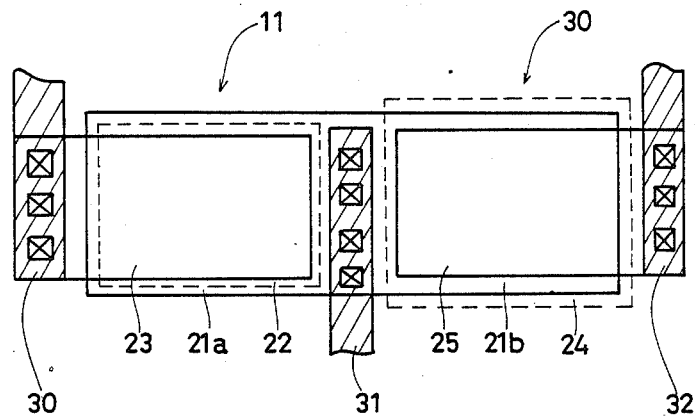
FIG. 7A is a view showing a concrete example of an arrangement of two capacitances of an RC network included in a programming high-voltage generator of an embodiment of the present invention.
Figure 7B:
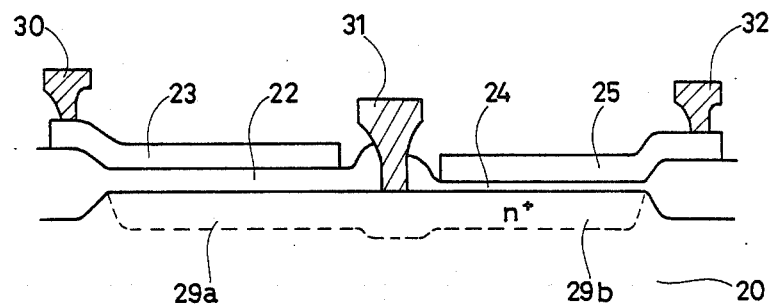
FIG. 7 B is a sectional view of the capacitances shown in FIG. 7A.

FIGS. 7A and 7B are views showing a structure of two capacitances included in the RC network shown in FIG. 6. FIG. 7A shows a plane arrangement thereof and FIG. 7B shows a sectional structure thereof. Referring to FIGS. 7A and 7B, a method for forming capacitors will be described.

A capacitor 11 in included in the switched capacitor 5 comprises: an active region 29a formed in a predetermined region of a semiconductor substrate 20; a first oxide film 22 formed on the active region 29a by the same manufacturing process as for a gate oxide film of a MOS transistor in an EEPROM chip; and a first polysilicon layer 23 on the first oxide film 22 by the same manufacturing process as for the gate electrode of the MOS transistor in the EEPROM chip. The first polysilicon layer 23 is connected through an aluminum interconnection 30 to a junction of the MOS transistors 9 and 10 forming the switched-capacitor 6.

Figure 1:
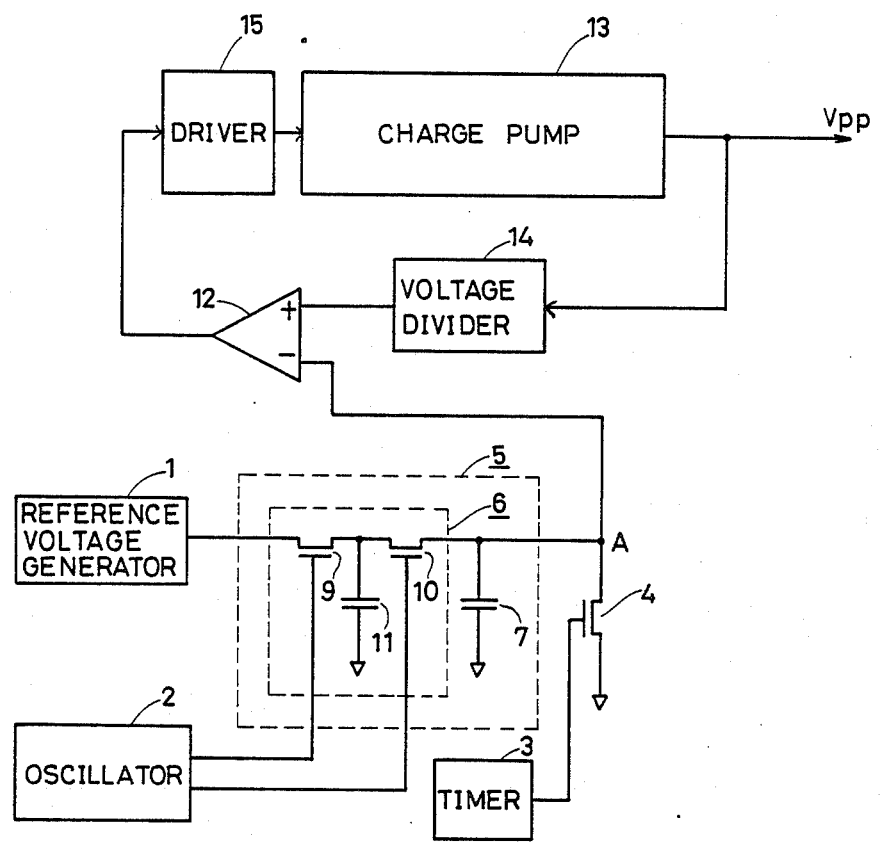
FIG. 1 is a schematic block diagram showing a structure of a conventional programming high-voltage pulse signal generator.
Figure 2:
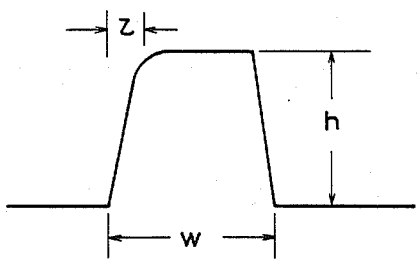
FIG. 2 is a diagram showing a waveform of a programming high-voltage pulse.
Figure 3:
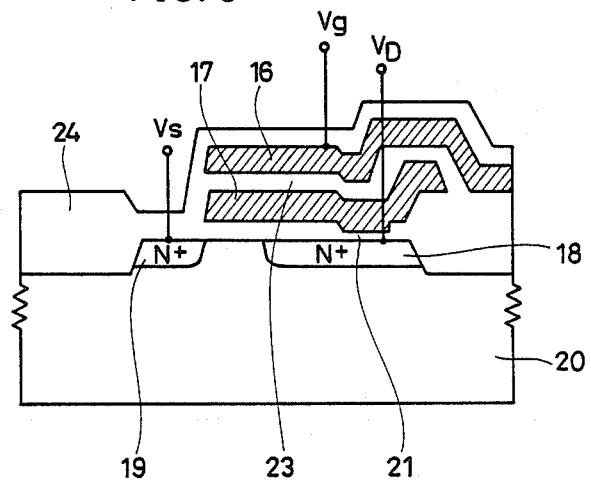
FIG. 3 is a sectional view showing schematically a structure of a memory transistor of an EEPROM.

A capacitor 30 of the RC network 5 comprises: an active region 29b formed in a predetermined region of the semiconductor substrate 20; a second oxide film 24 formed on the active region 29b by the same manufacturing process as for a tunnel oxide film (21 in FIG. 3) of a memory transistor; and a second polysilicon layer 25 formed on the second oxide film 24 by preferably the same manufacturing process as for a floating gate (17 in FIG. 3) of the memory transistor. The second polysilicon layer 25 is connected to the node A through an aluminum interconnection 32. The active regions 29a and 29b are grounded through an aluminum interconnection 31.

By using the capacitors 11 and 30 thus formed, the delay time (the time constant) $\tau$ of the RC network 5 can be changed according to the thickness of the tunnel oxide film of the memory transistor.

Figure 4:
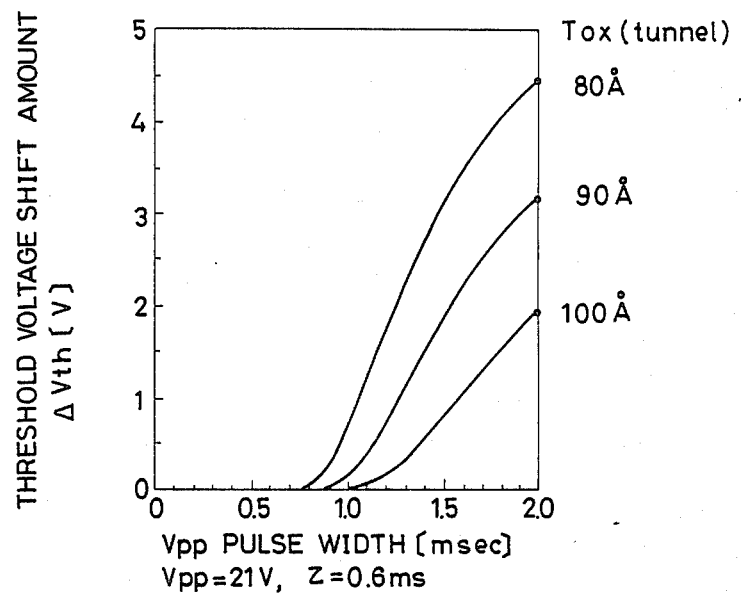
FIG. 4 is a graph showing the result obtained by simulation concerning a relation between a threshold voltage shift amount of a memory transistor and a thickness of a tunnel oxide film.
Figure 5:
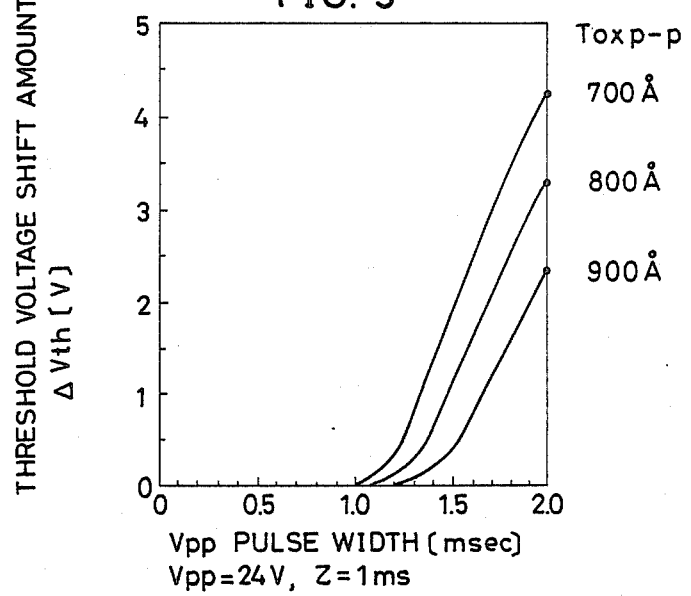
FIG. 5 is a graph showing the result obtained by simulation concerning a relation between a threshold voltage shift amount of a memory transistor and a thickness of the oxide film between a control gate and a floating gate.
Figure 8:
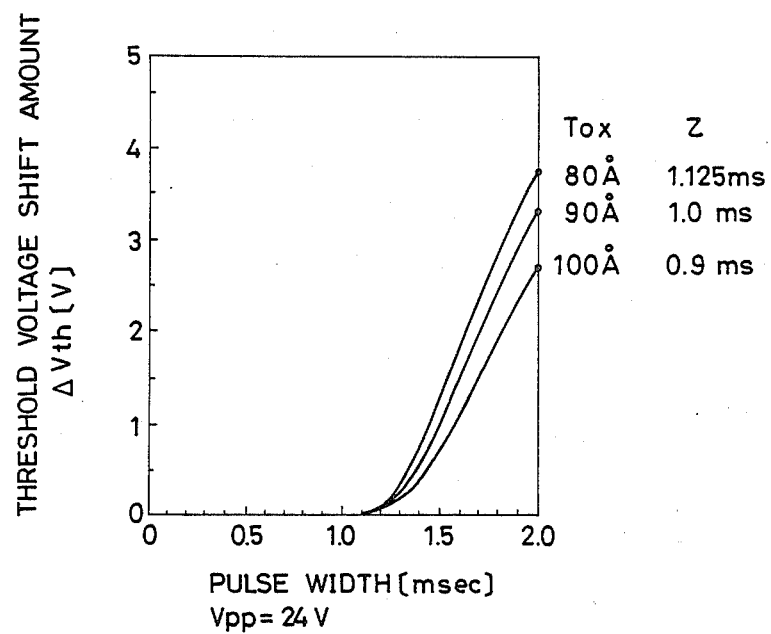
FIG. 8 is a graph showing the result obtained by simulation concerning a relation between a thickness of a tunnel oxide film and a threshold voltage shift amount in the case of using the circuit shown in FIG. 6.

FIG. 8 is a graph showing the result obtained by computer simulation concerning a relation between a threshold voltage shift amount $\Delta V_{th}$ and a thickness of the tunnel oxide film in the case of using the RC network 5 in accordance with an embodiment of the present invention. In FIG. 8, simulation conditions are set as indicated below for the purpose of comparison with the conventional example shown in FIG. 4. The simulation conditions are as follows: a designed value of the thickness of the polysilicon-polysilicon interlayer oxide film of the memory transistor is 800 Å; a designed value of the thickness of the tunnel oxide film of the memory transistor is 90 Å; and the time constant $\tau$ of the RC network 5 is 1 millisecond, which is longer than that in the conventional example shown in FIG. 4. The pulse height of the high-voltage pulse $V_{pp}$ is set to 24 V so as to apply the same threshold voltage shift amount $\Delta V_{th}$ as in the conventional example in FIG. 4 with the pulse width of the pulse signal $V_{pp}$ being 2 milliseconds.

Under the above indicated conditions, if the thickness of the tunnel oxide film is as thin as 80 Å, the capacitance of the capacitor 30 is 1.125 times as large as that in the case of the tunnel oxide film having a thickness of 90 Å. Accordingly, the time constant $\tau$ of the RC network 5 is $\tau = 1.125$ milliseconds from the equation $\tau = RC$ where R is a resistance value of the switched-capacitor 6 and C is a capacitance of the capacitor 30. If the thickness of the tunnel oxide film is 100 Å, the capacitance of the capacitor 30 is 0.9 times as much compared with the case of the tunnel oxide film having a thickness of 90 Å and the time constant $\tau$ at the rise of the high-voltage pulse $V_{pp}$ is 0.9 millisecond. Thus, by changing the time constant $\tau$ at the rise of the high-voltage pulse $V_{pp}$ according to the change of the thickness of the tunnel oxide film, the change of the threshold voltage shift amount $\Delta V_{th}$ according to the thickness of the tunnel oxide film is $\frac{1}{3}$ times as much as that in the conventional example, as can be seen from FIGS. 4 and 8. It is made possible to further decrease the deviation range of the threshold voltage shift amount according to the change of the thickness of the oxide film by setting more suitably the time constant $\tau$ at the rise of the high-voltage pulse $V_{pp}$ and the height of the high-voltage pulse $V_{pp}$.

Although in the above described embodiment, the capacitor of the RC network is formed of an oxide film formed by the same manufacturing process as for the tunnel oxide film, it may by of an oxide film formed by the same manufacturing process as for the polysilicon-polysilicon interlayer oxide film of the memory transistor (that is, the interlayer oxide film between the control gate and the floating gate). In this case, it becomes possible to decrease the deviation range of the threshold voltage shift amount $\Delta V_{th}$ due to a change of the thickness of the interlayer oxide film between the control gate and the floating gate. This is because if the interlayer oxide film between the control gate and the floating gate becomes thin, the electric field applied to the tunnel oxide film becomes relatively large but the capacitance of the RC network is increased to make gentle the rise of the high-voltage pulse $V_{pp}$ and accordingly it becomes possible to suppress an increase of the electric field to be applied to the tunnel oxide film.

In addition, the capacitor 30 of the RC network 5 may be formed by connecting in parallel a capacitor using an oxide film formed by the same manufacturing process as for the tunnel oxide film and a capacitor using an oxide film formed by the same manufacturing process as for the interlayer oxide film between the control gate and the floating gate. In this case, changes of the thicknesses of both the tunnel oxide film and the interlayer oxide film between the control gate and the floating gate can be corrected.

Furthermore, although in the above described embodiment, only the case of the erasing mode of the memory transistor was described, it goes without saying that the same argument is applied to the case of the writing mode.

As described in the foregoing, according to the present invention, the capacitance of the RC network of the programming high-voltage generator is formed of an oxide film formed by the same manufacturing process as for the tunnel oxide film or the polysilicon-polysilicon interlayer oxide film or both of them and as a result, the rise of the high-voltage pulse $V_{pp}$ can be changed according to the tunnel oxide film or the polysilicon-polysilicon interlayer oxide film or both of the oxide films. Thus, even if the thickness of the tunnel oxide film or the polysilicon-polysilicon interlayer oxide film is changed, the threshold voltage shift amount $\Delta V_{th}$ of the memory transistor can be made almost constant.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device forming a programming high-voltage pulse signal generator in an electrically erasable and programmable read-only memory device comprising data storage means including a plurality of memory transistors, each of said memory transistors comprising a semiconductor substrate, a control electrode, a floating gate for storing and emitting electric charge according to the voltage applied to said control electrode and a tunnel oxide film formed between said floating gate and said semiconductor substrate to serve as a path for electric charge, said high-voltage pulse signal generator comprising reference voltage generating means for generating a voltage signal serving as a reference of voltage for a high-voltage pulse generated by said high-voltage signal pulse generator, means for receiving the signal from said reference voltage generating means and providing a signal having a gentle rise to control the rise of said high-voltage pulse, and means for programming said data storage means using said high-voltage pulse signal generator, said means for receiving the signal including:
   a switched-capacitor equivalent to a resistor including a first capacitor having a first grounded electrode and means for electrically switching a second electrode of said first capacitor between said reference voltage generating means and said programming means, and
   a second capacitor formed of an oxide film having a thickness corresponding to the thickness of said tunnel oxide film, said capacitor connected in parallel to said programming means.

2. A semiconductor device as set forth in claim 1, wherein
   said oxide film of said second capacitor is formed by the same manufacturing process as for said tunnel oxide film.

3. A semiconductor device forming a programming high-voltage pulse signal generator in an electrically erasable and programmable read-only device comprising data storage means including a plurality of memory transistors, each of said memory transistors comprising a semiconductor substrate, a control gate, a floating gate for storing and emitting electric charges according to the voltage applied to said control gate and a first oxide film formed between said control gate and said floating gate, means for programming said data storage means using said high-voltage pulse signal generator, said high-voltage pulse signal generator comprising reference voltage generating means for generating a voltage signal serving as a reference of voltage for a high-voltage pulse generated by said high-voltage pulse signal generator and means for receiving the signal from said reference voltage generating means and providing a signal having a gentle rise to control the rise of said high-voltage pulse, said means for receiving the signal including:
   a switched-capacitor equivalent to a resistor including a first capacitor having a first grounded electrode and a second electrode and means for electrically switching the second electrode of said capacitor between said reference voltage generating means and said programming means, and
   a second capacitor formed of a second oxide film having a thickness corresponding to the thickness of said first oxide film, said second capacitor connected in parallel to said programming means.

4. A semiconductor device as set forth in claim 3, wherein
   said second oxide film is formed by the same manufacturing process as for said first oxide film.

5. A semiconductor device forming a programming high-voltage pulse generator in an electrically erasable and programmable read-only semiconductor memory device comprising data storage means including a plurality of memory transistors, each of said memory transistors comprising a semiconductor substrate, a control gate, a floating gate for storing and emitting electric charges according to the voltage applied to said control gate, a first oxide film formed between said control gate and said floating gate and a tunnel oxide film formed between said floating gate and said semiconductor substrate to serve as a path for electric charge, said high-voltage pulse signal generator comprising reference voltage generating means for generating a voltage signal serving as a reference of voltage for a high-voltage pulse generated by said high-voltage pulse generator and means for receiving the signal from said reference voltage generating means and providing a signal having a gentle rise to control the rise of said high-voltage signal, said means for receiving the signal including:

a switched-capacitor equivalent of a resistor including a first capacitor having a first grounded electrode and a second electrode, and means for electrically switching the second electrode of said first capacitor between said reference voltage generating means and said programming means, a second capacitor connected in parallel with said programming means and formed by connecting, in parallel, a third capacitor formed of an oxide film having a thickness corresponding to the thickness of said tunnel oxide film and a fourth capacitor formed of a second oxide film having a thickness corresponding to the thickness of said first oxide film.

6. A semiconductor device as set forth in claim 5, wherein said oxide film of said third capacitor and said oxide film of said fourth capacitor are formed by the same manufacturing process as for said tunnel oxide film and for said first oxide film, respectively.

* * * * *